United States Patent
Hargreaves et al.

(10) Patent No.: US 10,126,867 B2
(45) Date of Patent: Nov. 13, 2018

(54) MATCHED FILTER FOR A FIRST ORDER SIGMA DELTA CAPACITANCE MEASUREMENT SYSTEM AND A METHOD TO DETERMINE THE SAME

(71) Applicant: SYNAPTICS INCORPORATED, San Jose, CA (US)

(72) Inventors: Kirk Hargreaves, Mountain View, CA (US); Joseph Kurth Reynolds, San Jose, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/864,806

(22) Filed: Jan. 8, 2018

(65) Prior Publication Data

US 2018/0129344 A1    May 10, 2018

Related U.S. Application Data

(63) Continuation of application No. 14/726,273, filed on May 29, 2015, now Pat. No. 9,864,455.

(51) Int. Cl.
*G06F 3/041* (2006.01)
*H03M 3/00* (2006.01)

(52) U.S. Cl.
CPC .......... *G06F 3/0416* (2013.01); *H03M 3/462* (2013.01)

(58) Field of Classification Search
None
See application file for complete search history.

(56) References Cited

U.S. PATENT DOCUMENTS

| | | |
|---|---|---|
| 5,359,156 A | 10/1994 | Chan et al. |
| 6,040,793 A | 3/2000 | Ferguson, Jr. et al. |
| 6,700,391 B2 | 3/2004 | Strack et al. |
| 7,288,946 B2 | 10/2007 | Hargreaves et al. |
| 7,301,350 B2 | 11/2007 | Hargreaves et al. |
| 7,423,437 B2 | 9/2008 | Hargreaves et al. |
| 7,453,270 B2 | 11/2008 | Hargreaves et al. |
| 7,521,942 B2 | 4/2009 | Reynolds |
| 7,683,641 B2 | 3/2010 | Hargreaves et al. |
| 7,777,501 B2 | 8/2010 | Reynolds et al. |
| 7,777,503 B2 | 8/2010 | Reynolds |
| 7,973,542 B2 | 7/2011 | Reynolds |
| 7,977,954 B2 | 7/2011 | Reynolds et al. |
| 8,089,289 B1 | 1/2012 | Kremin et al. |

(Continued)

FOREIGN PATENT DOCUMENTS

DE    102005046699 A1    4/2007

*Primary Examiner* — Christopher Kohlman
(74) *Attorney, Agent, or Firm* — Patterson + Sheridan, LLP

(57) ABSTRACT

A processing system that includes a sigma-delta converter and a filter unit that applies a matched filter to the output of the sigma-delta converter. The processing system drives sensor electrodes for capacitive sensing and receives resulting signals with the sensor electrodes in response. The processing system applies these resulting signals to sigma-delta converters. The matched filter boosts the signal-to-noise ratio of the signal received from the sigma-delta converter, thereby improving the ability to sense presence of an input object. The filter unit may apply different, customized matched filters for different capacitive pixels to improve the signal-to-noise ratio of each capacitive pixel in a customized manner.

20 Claims, 13 Drawing Sheets

(56) References Cited

U.S. PATENT DOCUMENTS

| | | |
|---|---|---|
| 8,279,180 B2 | 10/2012 | Hotelling et al. |
| 8,564,313 B1 | 10/2013 | Ryshtun et al. |
| 8,570,053 B1 | 10/2013 | Ryshtun et al. |
| 2008/0111714 A1* | 5/2008 | Kremin ............... G06F 3/044 341/33 |
| 2009/0009491 A1 | 1/2009 | Grivna |
| 2011/0234528 A1 | 9/2011 | Guedon et al. |
| 2011/0307536 A1 | 12/2011 | Oya |
| 2012/0042973 A1 | 2/2012 | Ko |
| 2014/0066124 A1 | 3/2014 | Novet |

\* cited by examiner

US 10,126,867 B2

MATCHED FILTER FOR A FIRST ORDER SIGMA DELTA CAPACITANCE MEASUREMENT SYSTEM AND A METHOD TO DETERMINE THE SAME

CROSS-REFERENCE TO RELATED APPLICATIONS

This application is a continuation of U.S. patent application Ser. No. 14/726,273, filed May 29, 2015, which is incorporated by reference in its entirety.

BACKGROUND

Field of the Disclosure

Embodiments generally relate to input sensing and, in particular, to a matched filter for a first order sigma delta capacitance measurement system and a method to determine the matched filter.

Description of the Related Art

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location, and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers). Proximity sensor devices are also often used in smaller computing systems (such as touch screens integrated in cellular phones).

Proximity sensor devices generally include sensor electrodes for sensing the presence of input objects. A processing system drives the sensor electrodes and receives signals with the sensor electrodes. The processing system also processes the signals received with the sensor electrodes in order to detect the presence of input objects.

A processing will typically include analog processing circuitry that samples and filters signals received from sensor electrodes. This analog circuitry typically includes a charge integrator, a demodulator, filtering circuitry, and the like. One issue with analog circuitry, however, is that it occupies a large amount of physical area within a chip. Thus, it would be beneficial to reduce the amount of analog circuitry used in the processing system.

SUMMARY

A processing system for generating filtered digital touch capacitance data is provided. The processing system includes a sigma-delta converter that is configured to receive a first resulting signal with a first capacitive sensing electrode of a plurality of capacitive sensing electrodes and apply sigma-delta conversion to the first resulting signal to generate a first sigma-delta quantized signal. The processing system also includes a filter logic unit configured to apply a first matched filter to the sigma-delta quantized signal to generate a first filtered sigma-delta quantized signal.

A method for generating filtered digital touch capacitance data is also provided. The method includes receiving a first resulting signal with a first capacitive sensing electrode of a plurality of capacitive sensing electrodes. The method also includes applying sigma-delta conversion to the first resulting signal to generate a first sigma-delta quantized signal. The method further includes applying a first matched filter to the sigma-delta quantized signal to generate a first filtered sigma-delta quantized signal.

An input device is provided. The input device includes a plurality of capacitive sensing electrodes and a processing system coupled to the plurality of capacitive sensing electrodes. The processing system includes a sigma-delta converter that is configured to receive a first resulting signal with a first capacitive sensing electrode of a plurality of capacitive sensing electrodes and apply sigma-delta conversion to the first resulting signal to generate a first sigma-delta quantized signal. The processing system also includes a filter logic unit configured to apply a first matched filter to the sigma-delta quantized signal to generate a first filtered sigma-delta quantized signal.

BRIEF DESCRIPTION OF THE DRAWINGS

So that the manner in which the above recited features of embodiments can be understood in detail, a more particular description of embodiments, briefly summarized above, may be had by reference to embodiments, some of which are illustrated in the appended drawings. It is to be noted, however, that the appended drawings illustrate only typical embodiments and are therefore not to be considered limiting of scope, for other effective embodiments may be admitted.

To facilitate understanding, identical reference numerals have been used, where possible, to designate identical elements that are common to the figures. It is contemplated that elements of one embodiment may be beneficially incorporated in other embodiments.

DETAILED DESCRIPTION

The following detailed description is merely exemplary in nature and is not intended to limit the embodiments or the application and uses of such embodiments. Furthermore, there is no intention to be bound by any expressed or implied theory presented in the preceding technical field, background, brief summary or the following detailed description.

Various embodiments provide a processing system that includes a sigma-delta converter and a filter unit that applies a matched filter to the output of the sigma-delta converter. The processing system drives sensor electrodes for capacitive sensing and receives resulting signals with the sensor electrodes in response. The processing system applies these resulting signals to sigma-delta converters. The matched filter boosts the signal-to-noise ratio of the signal received from the sigma-delta converter, thereby improving the ability to sense presence of an input object. The filter unit may apply different, customized matched filters for different capacitive pixels to improve the signal-to-noise ratio of each capacitive pixel in a customized manner. Various embodiments also provide techniques for determining the particular matched filter to use for any given capacitive pixel.

Figure 1:
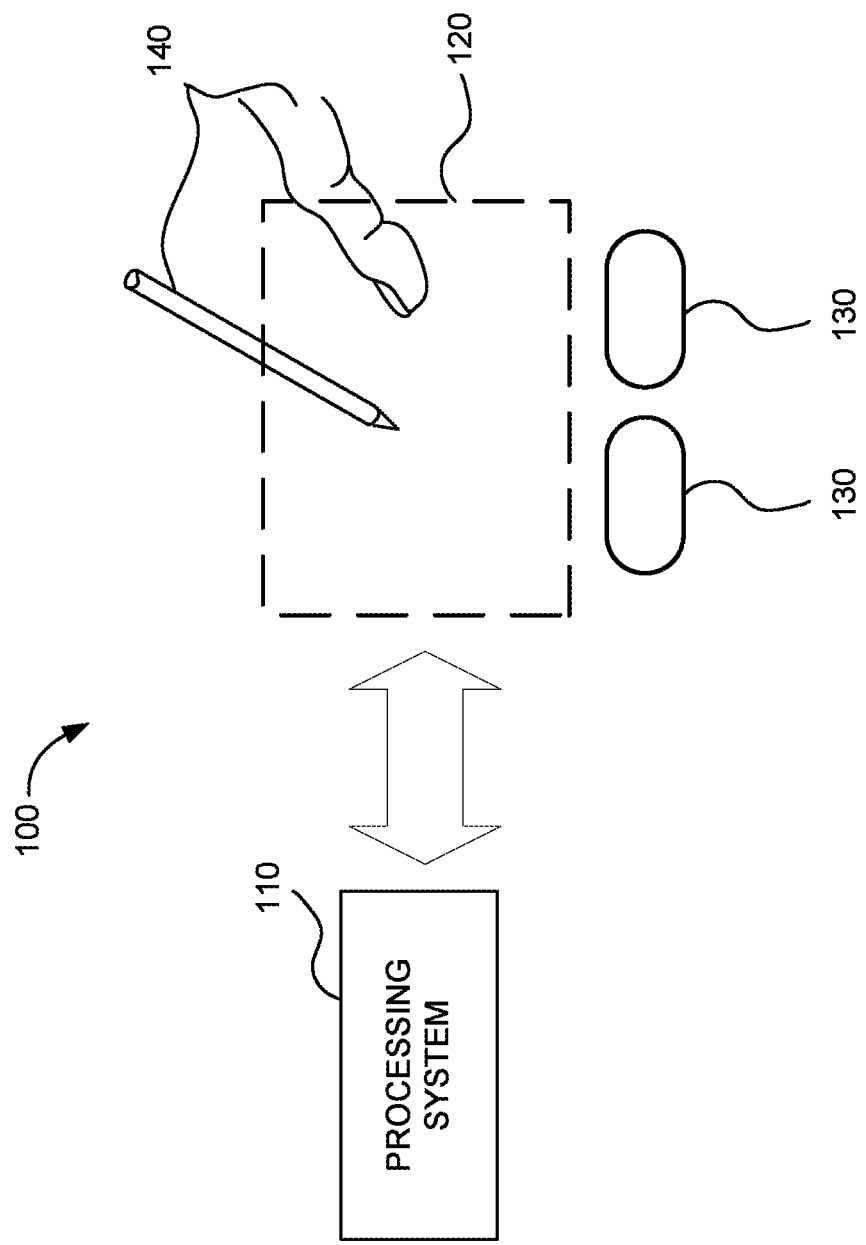
FIG. 1 is a block diagram of a system that includes an input device according to an example.

Turning now to the figures, FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system or can be physically separate from the electronic system. As appropriate, the input device 100 may communicate with parts of the electronic system using any one or more of the following: buses, networks, and other wired or wireless interconnections. Examples include I²C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in, and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g., a touch surface) of the input device 100, contact with an input surface of the input device 100 coupled with some amount of applied force or pressure, and/or a combination thereof. In various embodiments, input surfaces may be provided by surfaces of casings within which the sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and sensing technologies to detect user input in the sensing region 120. The input device 100 comprises one or more sensing elements for detecting user input. As several non-limiting examples, the input device 100 may use capacitive, elastive, resistive, inductive, magnetic, acoustic, ultrasonic, and/or optical techniques. Some implementations are configured to provide images that span one, two, three, or higher dimensional spaces. Some implementations are configured to provide projections of input along particular axes or planes. In some resistive implementations of the input device 100, a flexible and conductive first layer is separated by one or more spacer elements from a conductive second layer. During operation, one or more voltage gradients are created across the layers. Pressing the flexible first layer may deflect it sufficiently to create electrical contact between the layers, resulting in voltage outputs reflective of the point(s) of contact between the layers. These voltage outputs may be used to determine positional information.

In some inductive implementations of the input device 100, one or more sensing elements pick up loop currents induced by a resonating coil or pair of coils. Some combination of the magnitude, phase, and frequency of the currents may then be used to determine positional information.

In some capacitive implementations of the input device 100, voltage or current is applied to create an electric field. Nearby input objects cause changes in the electric field and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes. Some capacitive implementations utilize resistive sheets, which may be uniformly resistive.

Some capacitive implementations utilize "self capacitance" (or "absolute capacitance") sensing methods based on changes in the capacitive coupling between sensor electrodes and an input object. In various embodiments, an input object near the sensor electrodes alters the electric field near the sensor electrodes, changing the measured capacitive coupling. In one implementation, an absolute capacitance sensing method operates by modulating sensor electrodes with respect to a reference voltage (e.g., system ground) and by detecting the capacitive coupling between the sensor electrodes and input objects.

Some capacitive implementations utilize "mutual capacitance" (or "transcapacitance") sensing methods based on changes in the capacitive coupling between sensor electrodes. In various embodiments, an input object near the sensor electrodes alters the electric field between the sensor electrodes, changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals and/or to one or more sources of environmental interference (e.g., other electromagnetic signals). Sensor electrodes may be dedicated transmitters or receivers, or sensor electrodes may be configured to both transmit and receive. Alternatively, the receiver electrodes may be modulated relative to ground.

In FIG. 1, a processing system 110 is shown as part of the input device 100. The processing system 110 is configured to operate the hardware of the input device 100 to detect input in the sensing region 120. The processing system 110 comprises parts of, or all of, one or more integrated circuits (ICs) and/or other circuitry components. For example, a processing system for a mutual capacitance sensor device may comprise transmitter circuitry configured to transmit signals with transmitter sensor electrodes and/or receiver circuitry configured to receive signals with receiver sensor electrodes. In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100 and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s) to detect input, identification modules configured to identify gestures such as mode changing gestures, and mode changing modules for changing operation modes.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g., to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120 or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

Figure 2A:
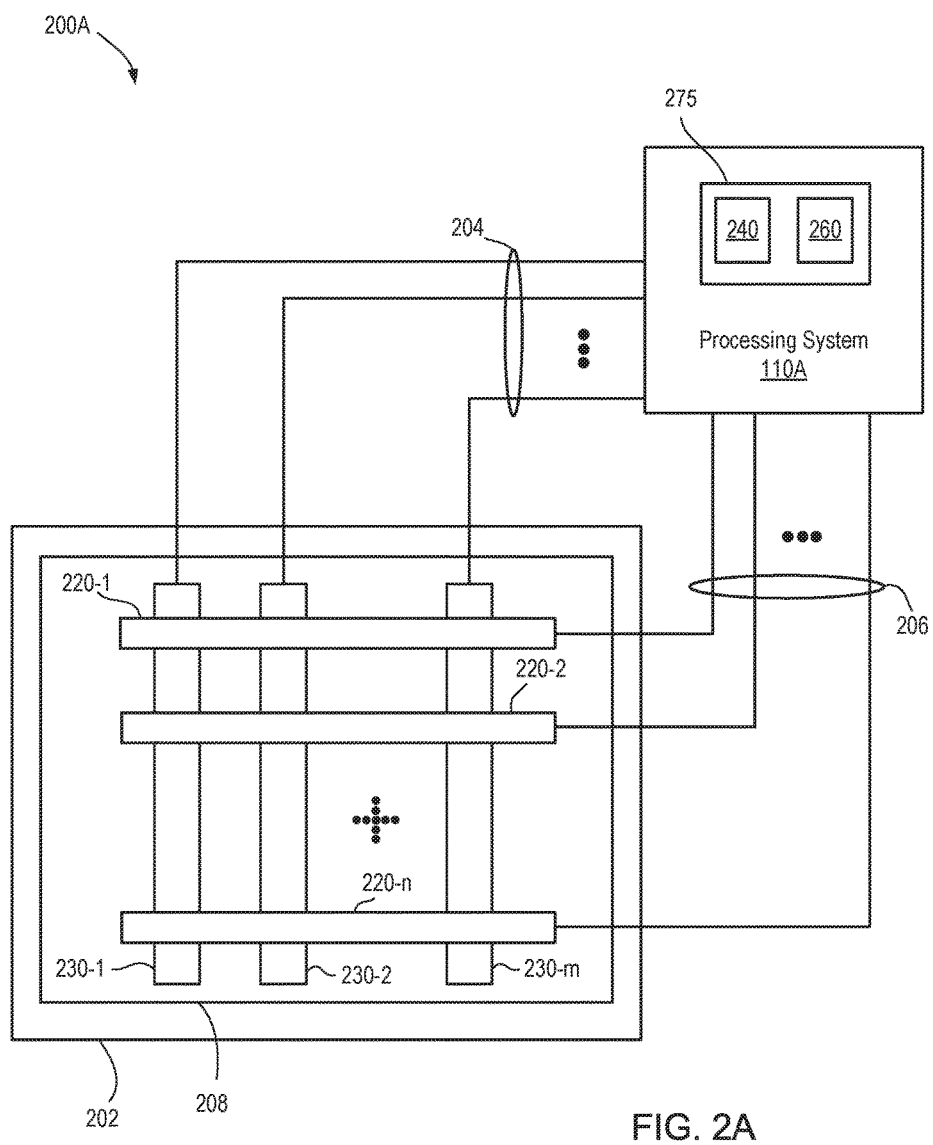
FIG. 2A is a block diagram depicting a capacitive sensor device according to an example.

FIG. 2A is a block diagram depicting a capacitive sensor device 200A according to an example. The capacitive sensor device 200A comprises an example implementation of the input device 100 shown in FIG. 1. The capacitive sensor device 200A includes a sensor electrode collection 208 coupled to an example implementation of the processing system 110 (referred to as "the processing system 110A"). As used herein, general reference to the processing system 110 is a reference to the processing system described in FIG. 1 or any other embodiment thereof described herein (e.g., the processing system 110A, 110B, etc.).

The sensor electrode collection 208 is disposed on a substrate 202 to provide the sensing region 120. The sensor electrode collection 208 includes sensor electrodes disposed on the substrate 202. In the present example, the sensor electrode collection 208 includes two pluralities of sensor electrodes 220-1 through 220-N (collectively "sensor electrodes 220"), and 230-1 through 230-M (collectively "sensor electrodes 230"), where M and N are integers greater than zero. The sensor electrodes 220 and 230 are separated by a dielectric (not shown). The sensor electrodes 220 and the sensor electrodes 230 can be non-parallel. In an example, the sensor electrodes 220 are disposed orthogonally with the sensor electrodes 230.

In some examples, the sensor electrodes 220 and the sensor electrodes 230 can be disposed on separate layers of the substrate 202. In other examples, the sensor electrodes 220 and the sensor electrodes 230 can be disposed on a single layer of the substrate 202. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

In the present example, the sensor electrode collection 208 is shown with the sensor electrodes 220, 230 generally arranged in a rectangular grid of intersections of orthogonal sensor electrodes. It is to be understood that the sensor electrode collection 208 is not limited to such an arrangement, but instead can include numerous sensor patterns. Although the sensor electrode collection 208 is depicted as rectangular, the sensor electrode collection 208 can have other shapes, such as a circular shape.

As discussed below, the processing system 110A can operate the sensor electrodes 220, 230 according to a plurality of excitation schemes, including excitation scheme(s) for mutual capacitance sensing ("transcapacitive sensing") and/or self-capacitance sensing ("absolute capacitive sensing"). In a transcapacitive excitation scheme, the processing system 110A drives the sensor electrodes 230 with transmitter signals (the sensor electrodes 230 are "transmitter electrodes"), and receives resulting signals from the sensor electrodes 220 (the sensor electrodes 220 are "receiver electrodes"). In some embodiments, sensor electrodes 220 may be transmitter electrodes and sensor electrodes 230 may be receiver electrodes. The sensor electrodes 230 can have the same or different geometry as the sensor electrodes 220. In an example, the sensor electrodes 230 are wider and more closely distributed than the sensor electrodes 220, which are thinner and more sparsely distributed. Similarly, in an embodiment, sensor electrodes 220 may be wider and/or more sparsely distributed. Alternatively, the sensor electrodes 220, 230 can have the same width and/or the same distribution.

The sensor electrodes 220 and the sensor electrodes 230 are coupled to the processing system 110A by conductive routing traces 204 and conductive routing traces 206, respectively. The processing system 110A is coupled to the sensor electrodes 220, 230 through the conductive routing traces 204, 206 to implement the sensing region 120 for sensing inputs. Each of the sensor electrodes 220 can be coupled to at least one routing trace of the routing traces 206. Likewise, each of the sensor electrodes 230 can be coupled to at least one routing trace of the routing traces 204.

Figure 2B:
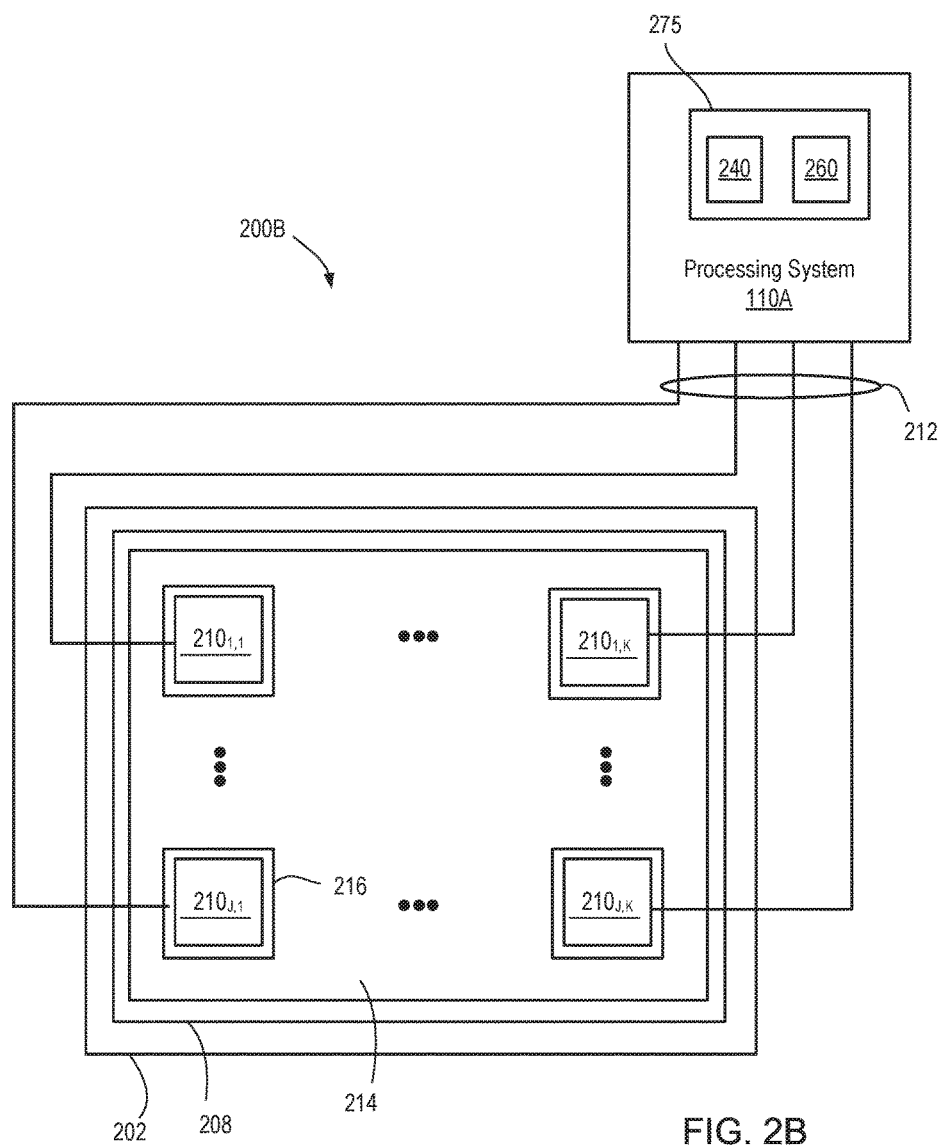
FIG. 2B is a block diagram depicting another capacitive sensor device according to an example.

FIG. 2B is a block diagram depicting a capacitive sensor device 200B according to an example. The capacitive sensor device 200B comprises another example implementation of the input device 100 shown in FIG. 1. In the present example, the sensor electrode collection 208 includes a plurality of sensor electrodes $210_{1,1}$ through $210_{J,K}$, where J and K are integers (collectively "sensor electrodes 210"). The sensor electrodes 210 are ohmically isolated from each other and the grid electrode 214. The sensor electrodes 210 can be separated from the grid electrode 214 by a gap 216. In the present example, the sensor electrodes 210 are arranged in a rectangular matrix pattern, where at least one of J or K is greater than zero. The sensor electrodes 210 can be arranged in other patterns, such as polar arrays, repeating patterns, non-repeating patterns, or like type arrangements. In various embodiments, the grid electrode(s) is optional and may not be included. Similar to the capacitive sensor device 200A, the processing system 110A can operate the sensor electrodes 210 and the grid electrode 214 according to a plurality of excitation schemes, including excitation scheme(s) for transcapacitive sensing and/or absolute capacitive sensing.

In some examples, the sensor electrodes 210 and the grid electrode 214 can be disposed on separate layers of the substrate 202. In other examples, the sensor electrodes 210 and the grid electrode 214 can be disposed on a single layer of the substrate 202. The sensor electrodes 210 can be on the same and/or different layers as the sensor electrodes 220 and the sensor electrodes 230. While the sensor electrodes are shown disposed on a single substrate 202, in some embodiments, the sensor electrodes can be disposed on more than one substrate. For example, some sensor electrodes can be disposed on a first substrate, and other sensor electrodes can be disposed on a second substrate adhered to the first substrate.

The sensor electrodes 210 are coupled to the processing system 110A by conductive routing traces 212. The processing system 110A can also be coupled to the grid electrode 214 through one or more routing traces (not shown for clarity). The processing system 110A is coupled to the sensor electrodes 210 through the conductive routing traces 212 to implement the sensing region 120 for sensing inputs.

Referring to FIGS. 2A and 2B, the capacitive sensor device 200A or 200B can be utilized to communicate user input (e.g., a user's finger, a probe such as a stylus, and/or some other external input object) to an electronic system (e.g., computing device or other electronic device). For example, the capacitive sensor device 200A or 200B can be implemented as a capacitive touch screen device that can be placed over an underlying image or information display device (not shown). In this manner, a user would view the underlying image or information display by looking through substantially transparent elements in the sensor electrode collection 208. When implemented in a touch screen, the substrate 202 can include at least one substantially transparent layer (not shown). The sensor electrodes and the conductive routing traces can be formed of substantially transparent conductive material. Indium tin oxide (ITO) and/or thin, barely visible wires are but two of many possible examples of substantially transparent material that can be used to form the sensor electrodes and/or the conductive routing traces. In other examples, the conductive routing traces can be formed of non-transparent material, and then hidden in a border region (not shown) of the sensor electrode collection 208.

In another example, the capacitive sensor device 200A or 200B can be implemented as a capacitive touchpad, slider, button, or other capacitance sensor. For example, the substrate 202 can be implemented with, but not limited to, one or more clear or opaque materials. Likewise, clear or opaque conductive materials can be utilized to form sensor electrodes and/or conductive routing traces for the sensor electrode collection 208.

In general, the processing system 110A excites or drives sensing elements of the sensor electrode collection 208 with a sensing signal and measures an induced or resulting signal that includes the sensing signal and effects of input in the sensing region 120. The terms "excite" and "drive" as used herein encompasses controlling some electrical aspect of the driven element. For example, it is possible to drive current through a wire, drive charge into a conductor, drive a substantially constant or varying voltage waveform onto an electrode, etc. A sensing signal can be constant, substantially constant, or varying over time, and generally includes a shape, frequency, amplitude, and phase. A sensing signal can be referred to as an "active signal" as opposed to a "passive signal," such as a ground signal or other reference signal. A sensing signal can also be referred to as a "transmitter signal" when used in transcapacitive sensing, or an "absolute sensing signal" or "modulated signal" when used in absolute sensing.

In an example, the processing system 110A drives sensing element(s) of the sensor electrode collection 208 with a voltage and senses resulting respective charge on sensing element(s). That is, the sensing signal is a voltage signal and the resulting signal is a charge signal (e.g., a signal indicative of accumulated charge, such as an integrated current signal). Capacitance is proportional to applied voltage and inversely proportional to accumulated charge. The processing system 110A can determine measurement(s) of capacitance from the sensed charge. In another example, the processing system 110A drives sensing element(s) of the sensor electrode collection 208 with charge and senses resulting respective voltage on sensing element(s). That is, the sensing signal is a signal to cause accumulation of charge (e.g., current signal) and the resulting signal is a voltage signal. The processing system 110A can determine measurement(s) of capacitance from the sensed voltage. In general, the term "sensing signal" is meant to encompass both driving voltage to sense charge and driving charge to sense voltage, as well as any other type of signal that can be used to obtain indicia of capacitance. "Indicia of capacitance" include measurements of charge, current, voltage, and the like, from which capacitance can be derived.

The processing system 110A can include a sensor module 240 and a determination module 260. The sensor module 240 and the determination module 260 comprise modules that perform different functions of the processing system 110A. In other examples, different configurations of one or more modules can perform the functions described herein. The sensor module 240 and the determination module 260 can include circuitry 275 and can also include firmware, software, or a combination thereof operating in cooperation with the circuitry 275.

The sensor module 240 selectively drives sensing signal(s) on one or more sensing elements of the sensor electrode collection 208 over one or more cycles ("excitation cycles") in accordance with one or more schemes ("excitation schemes"). During each excitation cycle, the sensor module 240 can selectively sense resulting signal(s) from one or more sensing elements of the sensor electrode collection 208. Each excitation cycle has an associated time period during which sensing signals are driven and resulting signals measured.

In one type of excitation scheme, the sensor module 240 can selectively drive sensing elements of the sensor electrode collection 208 for absolute capacitive sensing. In absolute capacitive sensing, the sensor module 240 drives selected sensing element(s) with an absolute sensing signal and senses resulting signal(s) from the selected sensing element(s). In such an excitation scheme, measurements of absolute capacitance between the selected sensing element(s) and input object(s) are determined from the resulting signal(s). In an example, the sensor module 240 can drive selected sensor electrodes 220, and/or selected sensor electrodes 230, with an absolute sensing signal. In another example, the sensor module 240 can drive selected sensor electrodes 210 with an absolute sensing signal.

In another type of excitation scheme, the sensor module 240 can selectively drive sensing elements of the sensor electrode collection 208 for transcapacitive sensing. In transcapacitive sensing, the sensor module 240 drives selected transmitter sensor electrodes with transmitter signal(s) and senses resulting signals from selected receiver sensor electrodes. In such an excitation scheme, measurements of transcapacitance between transmitter and receiver electrodes are determined from the resulting signals. In an example, the sensor module 240 can drive the sensor electrodes 230 with transmitter signal(s) and receive resulting signals on the sensor electrodes 220. In another example, the sensor module 240 can drive selected sensor electrodes 210 with transmitter signal(s), and receive resulting signals from others of the sensor electrodes 210.

In any excitation cycle, the sensor module 240 can drive sensing elements of the sensor electrode collection 208 with other signals, including reference signals and guard signals. That is, those sensing elements of the sensor electrode collection 208 that are not driven with a sensing signal, or sensed to receive resulting signals, can be driven with a reference signal, a guard signal, or left floating (i.e., not driven with any signal). A reference signal can be a ground signal (e.g., system ground) or any other constant or substantially constant voltage signal. A guard signal can be a signal that is similar or the same in at least one of shape, amplitude, frequency, or phase of a transmitter signal.

"System ground" may indicate a common voltage shared by system components. For example, a capacitive sensing system of a mobile phone can, at times, be referenced to a system ground provided by the phone's power source (e.g., a charger or battery). The system ground may not be fixed relative to earth or any other reference. For example, a mobile phone on a table usually has a floating system ground. A mobile phone being held by a person who is strongly coupled to earth ground through free space may be grounded relative to the person, but the person-ground may be varying relative to earth ground. In many systems, the system ground is connected to, or provided by, the largest area electrode in the system. The capacitive sensor device 200A or 200B can be located proximate to such a system ground electrode (e.g., located above a ground plane or backplane).

The determination module 260 performs capacitance measurements based on resulting signals obtained by the sensor module 240. The capacitance measurements can include changes in capacitive couplings between elements (also referred to as "changes in capacitance"). For example, the determination module 260 can determine baseline measurements of capacitive couplings between elements without the presence of input object(s). The determination module 260 can then combine the baseline measurements of capacitive couplings with measurements of capacitive couplings in the presence of input object(s) to determine changes in capacitive couplings.

In an example, the determination module 260 can perform a plurality of capacitance measurements associated with specific portions of the sensing region 120 as "capacitive pixels" to create a "capacitive image" or "capacitive frame." A capacitive pixel of a capacitive image represents a location within the sensing region 120 in which a capacitive coupling can be measured using sensing elements of the sensor electrode collection 208. For example, a capacitive pixel can correspond to a transcapacitive coupling between a sensor electrode 220 and a sensor electrode 230 affected by input object(s). In another example, a capacitive pixel can correspond to an absolute capacitance of a sensor electrode 210. The determination module 260 can determine an array of capacitive coupling changes using the resulting signals obtained by the sensor module 240 to produce an x-by-y array of capacitive pixels that form a capacitive image. The capacitive image can be obtained using transcapacitive sensing (e.g., transcapacitive image), or obtained using absolute capacitive sensing (e.g., absolute capacitive image). In this manner, the processing system 110A can capture a capacitive image that is a snapshot of the response measured in relation to input object(s) in the sensing region 120. A given capacitive image can include all of the capacitive pixels in the sensing region, or only a subset of the capacitive pixels.

In another example, the determination module 260 can perform a plurality of capacitance measurements associated with a particular axis of the sensing region 120 to create a "capacitive profile" along that axis. For example, the determination module 260 can determine an array of absolute capacitive coupling changes along an axis defined by the sensor electrodes 220 and/or the sensor electrodes 230 to produce capacitive profile(s). The array of capacitive coupling changes can include a number of points less than or equal to the number of sensor electrodes along the given axis.

Measurement(s) of capacitance by the processing system 110A, such as capacitive image(s) or capacitive profile(s), enable the sensing of contact, hovering, or other user input with respect to the formed sensing regions by the sensor electrode collection 208. The determination module 260 can utilize the measurements of capacitance to determine positional information with respect to a user input relative to the sensing regions formed by the sensor electrode collection 208. The determination module 260 can additionally or alternatively use such measurement(s) to determine input object size and/or input object type.

Figure 3:
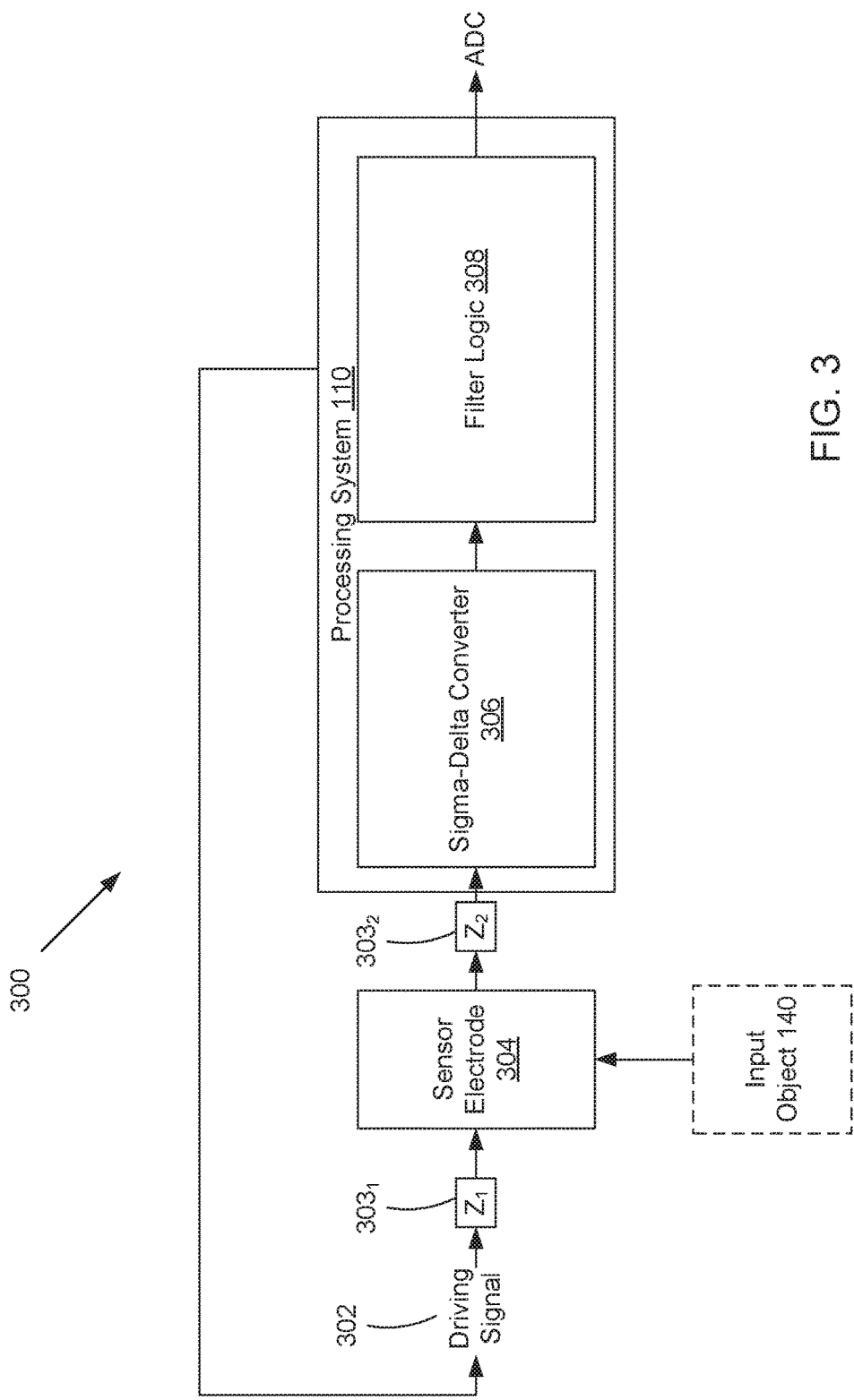
FIG. 3 is a block diagram of a matched filter system for digitizing analog data received from a capacitive sensor, according to an example.

FIG. 3 is a block diagram of a matched filter system 300 for digitizing analog data received from a capacitive sensor electrode 304, according to an example. Sensor electrode 304 may be any of sensor electrodes 220, sensor electrodes 230, or sensor electrodes 210 described above with respect to FIGS. 2A and 2B.

As shown, the matched filter system 300 includes a sensor electrode 304 and a processing system 110. The processing system 110 includes a sigma-delta converter 306 and filter logic 308. In operation, processing system 110 drives sensor electrode 304 with a driving signal 302 to sense the presence of an input object 140 in a sensing region associated with sensor electrode 304. The driving signal 302 is a periodic pulse wave signal—a periodic sequence of high voltage values followed by low voltage values. The impedance characteristics of a transmission line $303_1$ through which driving signal 302 travels to arrive at sensor electrode 304 are represented by symbol $Z_1$ and the impedance characteristics of a transmission line $303_2$ through which the response of sensor electrode 304 to the driving signal 302 travels to processing system 110 are represented by symbol $Z_2$. When the driving signal 302 is applied to the sensor electrode 304, the sensor electrode 304 alters the driving signal 302 in a particular manner to generate a signal (which may be referred to as a "resulting signal"). The signal received by processing system 110 from sensor electrode 304 in response to driving signal 302 is based on these impedance characteristics $Z_1$, $Z_2$ and on the capacitance of sensor electrode 304, as affected by input object 140, if present.

The processing system 110 applies this received signal to the sigma-delta converter 306 ("SD converter"). The sigma-delta converter 306 applies a sigma-delta conversion to the signal to generate a sigma-delta quantized signal (or simply an "SD signal"). The SD signal is a digital, binary representation that is characteristic of the resulting signal. More specifically, the SD signal includes a series of pulses, each pulse having one of two values. A particular stretch of time of this series of pulses can be thought of as a digital encoding of the resulting signal received by the SD converter 306. The particular encoding is dependent on the waveform of the resulting signal received by the sigma-delta converter 306.

The sigma-delta converter 306 converts the analog signal received from sensor electrode 304 into a digital signal. The SD converter 306 replaces analog circuitry that may be used in other processing systems, such as sample-and-hold circuitry, and the like, and thus reduces the amount of chip area that is designated for use by analog elements. Additional processing to "condition" the signal received from the SD converter 306, including application of a matched filter, is described herein. This additional processing reduces noise in the digital signal received from the SD converter 306.

The sigma-delta converter 306 outputs the SD signal to the filter logic 308, which applies a matched filter to the sigma-delta converter to generate a filtered sigma-delta quantized signal ("filtered SD signal") and outputs an analog-to-digital conversion value ("ADC" or "ADC value") based on the filtered sigma-delta quantized signal. The matched filter helps to reduce noise of the SD signal. The functionality and results of applying the matched filter are discussed in further detail below.

The circuit of FIG. 3 may be used with transcapacitive or self-capacitive sensing configurations. In either case, a capacitor is modulated with a particular signal and a signal is sensed in response. That signal is applied to the sigma-delta converter 306 and filter logic 308 to generate an ADC value.

Figure 4:
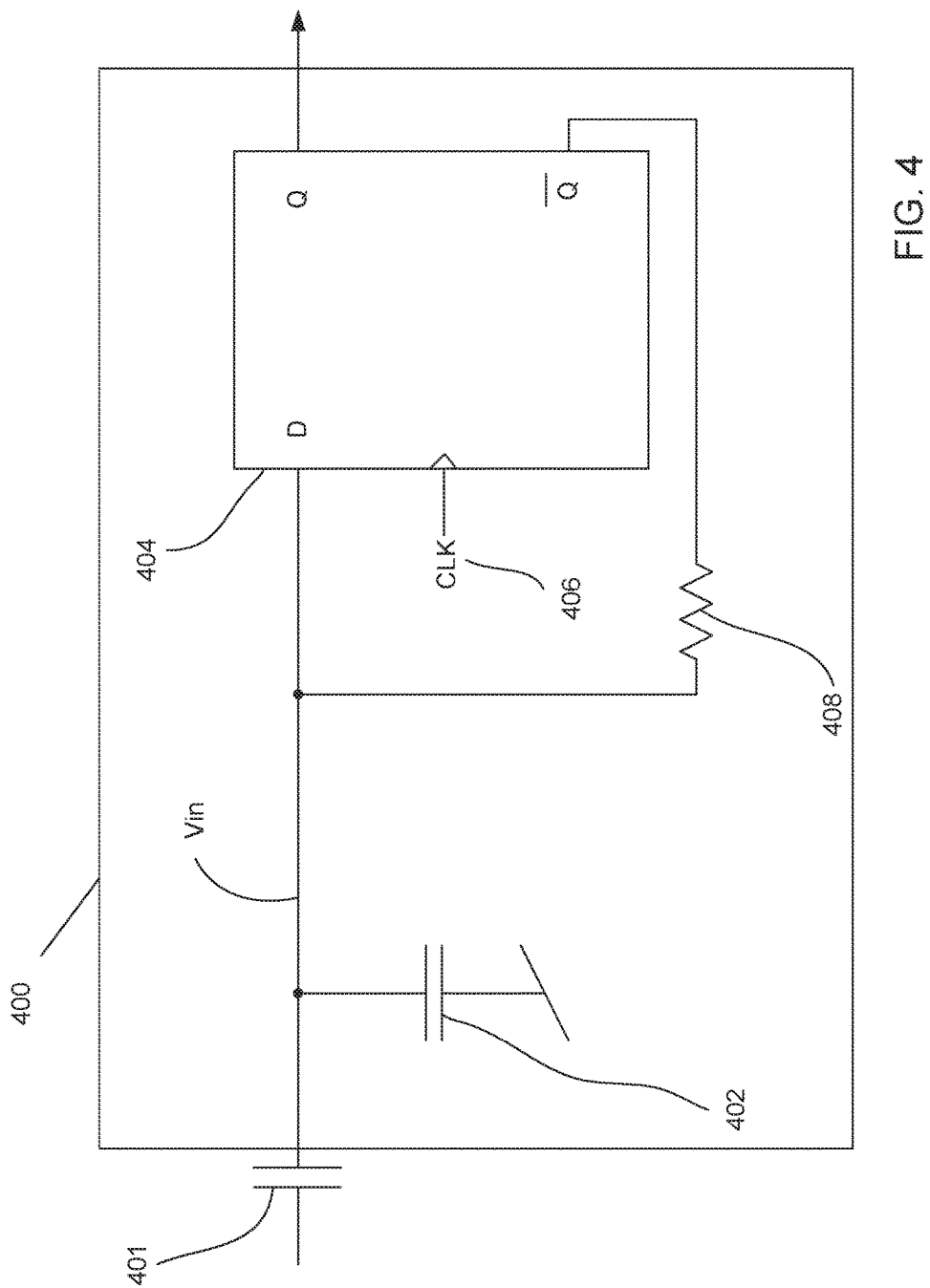
FIG. 4 illustrates a sigma-delta converter, according to an example.

FIG. 4 illustrates a sigma-delta converter 400, according to an example. The example sigma-delta converter 400 shown in FIG. 4 may be used as the sigma-delta converter 306 of the matched filter system 300 of FIG. 3.

As shown, the sigma-delta converter 400 includes a flip-flop 404. The flip-flop 404 includes an input (marked "D") as well as a positive output (marked "Q") and a negative output ("Q-bar"—shown as Q with a line above in FIG. 4). A feedback resistor 408 couples the negative output to the input to provide feedback. The input is coupled to a sensing capacitor 401, which represents the sensor electrode 304 of FIG. 3. Parasitic capacitance 402 represents capacitance parasitics from the Vin node to other components.

In operation, the signal received from the sensing capacitor 401, which is the "resulting signal" in the discussion above, is applied to the input of the flip-flop 404 as shown. If the voltage of this signal is above the switching threshold of the flip-flop 404, then the positive output of the flip-flop 404 is a high voltage (e.g., VDD) and the negative output of the flip-flop 404 is a low voltage (e.g., GND). If the voltage of the signal is below the switching threshold, then the positive output of the flip-flop 404 is a low voltage and the negative output of the flip-flop 404 is a high voltage.

The feedback resistor 408 functions to pull Vin towards the threshold voltage of the flip-flop 404. More specifically, when Vin is higher than the switching threshold, the negative output of the flip-flop 404 is low, which causes charge to flow from Vin across the resistor 408 to the negative output of the flip-flop 404. Thus, Vin reduces by a certain amount. Conversely, when Vin is lower than the switching threshold of the flip-flop 404, the negative output of the flip-flop 404 is high, which causes charge to flow from the negative output of the flip-flop 404 to Vin. The positive output of the flip-flop 404 is a logical high when Vin is higher than the threshold and a logical low when Vin is lower than the threshold. The flip-flop 404 is clocked with a flip-flop clock signal 406, having a frequency substantially higher than the frequency of the driving signal 302. In one embodiment, the frequency of the flip-flop clock signal 406 is at least twenty times greater than the frequency of the driving signal 302.

Note that the resulting signal is driven to a voltage that is substantially higher or lower than the switching threshold of the flip-flop 404 when the driving signal 302 first transitions from low to high or from high to low. If at any time, Vin becomes substantially above or below the switching threshold of the flip-flop 404, then the positive output of the flip-flop 404 will remain a logical high or a logical low for multiple clock cycles because the amount of charge that can flow across the feedback resistor 408 in a given clock cycle (and thus the amount of voltage change at Vin) is limited. This happens when the driving signal 302 transitions as described above. If Vin is not substantially above or below the switching threshold, then the positive output of the flip-flop 404 will oscillate between a logical low and a logical high value each clock cycle, as the current flow across 408 will cause Vin to transition from below (or above) the switching threshold of the flip-flop 404 to above (or below) the switching threshold of the flip-flop 404. This happens a certain amount of time after the driving signal 302 transitions as described above. Vin is said to have "settled" at this point.

Thus, the length of time at which the positive output of the flip-flop 404 remains at a particular logical value is representative of an "initial" amplitude of Vin (that is, the amplitude of Vin at an early time after the sensing capacitor 401 has been modulated for capacitive sensing). More generally, the specific sequence of logical values output from the positive output of the flip-flop 404 is reflective of the resulting signal received from the sensing capacitor 401 (whose capacitance is modified by the presence of an input object 104, if any). Note that the positive output of the flip-flop 404 is the sigma-delta quantized signal that is provided to the filter logic 308 of FIG. 3.

Figure 5:
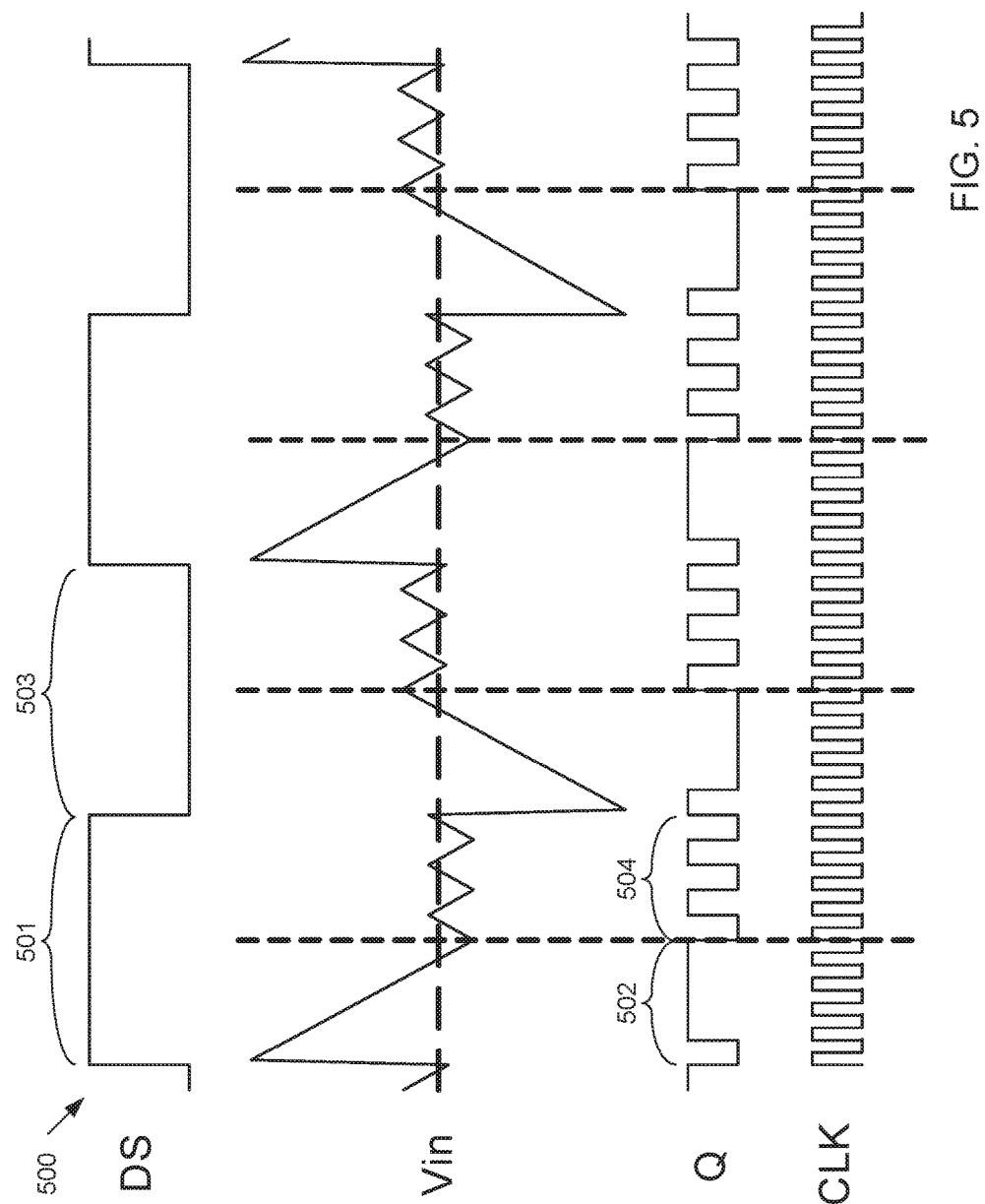
FIG. 5 is a graph that illustrates signals associated with the operation of a sigma-delta converter, according to an example.

FIG. 5 is a graph 500 that illustrates signals associated with operation of the sigma-delta converter 400, according to an example. The graph 500 includes four plots of voltage vs. time.

The first plot, labeled "DS" (for "driven signal") represents voltage corresponding to the driving signal 302 of FIG. 3. This DS signal is a pulse wave that includes a repeating pattern of high-voltage and low-voltage transitions. The driven signal includes a period in which the signal transitions from low to high—a first half-period 501, and a period in which the signal transitions from high to low—a second half-period 503. The second plot, labeled "Vin," represents voltage at the node "Vin" in FIG. 4. The third plot, labeled "Q," represents the voltage output from the positive output of the flip-flop 404 of FIG. 4. The fourth plot, labeled "CLK" represents the voltage at the clock input 406 to the flip-flop of FIG. 4, which is labeled "CLK" in FIG. 4.

When the voltage of DS transitions from low to high, the voltage at Vin also transitions from low to high. Due to the operation of the flip-flop 404, including the feedback resistor 408, the voltage at Vin drops (or increases) by a certain amount each flip-flop clock cycle. Thus, for each clock cycle after Vin is brought high by DS, Vin decreases by a certain amount until Vin falls below the switching threshold of the flip-flop 404. For each clock cycle during which Vin is above the switching threshold of the flip-flop 404, the value of Q is a logical high. After Vin falls below the switching threshold of the flip-flop 404, the value of Q oscillates due to the feedback across the resistor 408. More specifically, when Q is low, Qbar is high, which pushes charge across the resistor 408, raising the voltage at Vin. This, in turn, causes Qbar to be low, which pulls charge across the resistor 408, decreasing the voltage at Vin.

The Q signal is a digital output from the sigma-delta converter 400. The processing system 110, including filter logic 308, processes the Q signal in order to obtain a value representative of the capacitance of the sensor electrode 304 (sensing capacitor 401 in FIG. 4).

The Q signal includes a first portion 502 (or a "pre-settled portion") that is generally indicative of the response of the sensing capacitor 401 to the driving signal 302 (the portion after the transition in DS and before the thick dotted black line) and a second portion 504 (or a "post-settled portion") that is generally not indicative of the response of the sensing capacitor 401 to the driving signal 302 (the portion after the thick dotted black line and before the next transition in DS). Thus, the first portion 502 includes information from which capacitance information of the sensing capacitor 401 can be extracted and, in general, the second portion 504 does not, because the second portion simply oscillates between a high and low value. In addition, the second portion may have the ability to introduce substantial noise to processing done on the Q value because of these oscillations. For these reasons, filter logic 308 applies a matched filter to the SD signal in order to process that signal to obtain a digital value representative of the capacitance of the sensor electrode 304.

Figure 6:
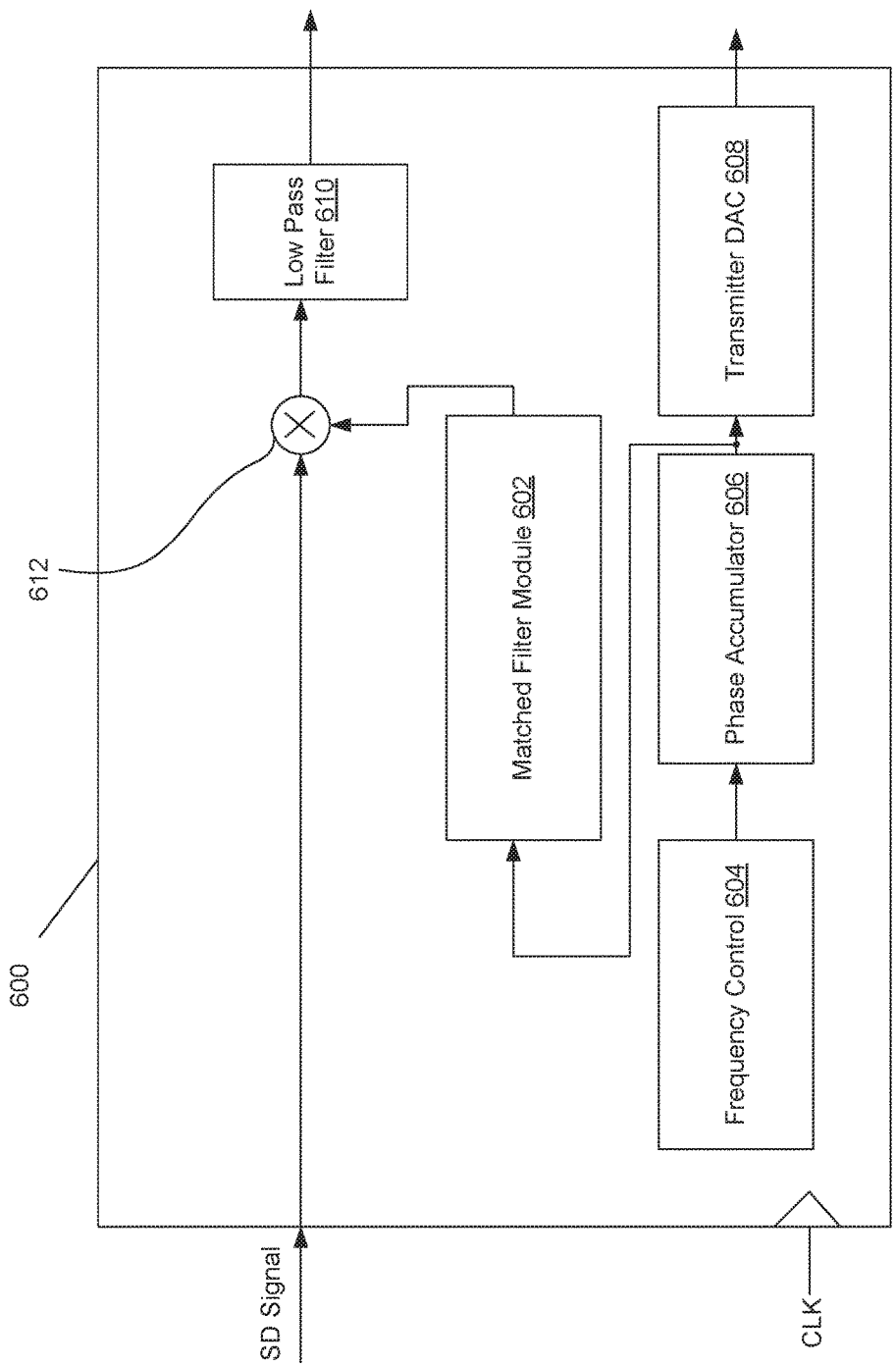
FIG. 6 is a block diagram that illustrates a filter logic, according to an example.

FIG. 6 is a block diagram that illustrates a filter logic 600, according to an example. The filter logic 600 may be used as the filter logic 308 illustrated in FIG. 3. As shown, the filter logic 600 includes a matched filter module 602, a frequency control block 604, a phase accumulator 606, a transmitter digital-to-analog converter 608, and a low-pass filter 610.

The matched filter module 602 applies the matched filter to an incoming SD signal at multiplier 612. The frequency control block 604 controls the frequency of the signal with which the processing system 110 drives the sensor electrode 304 (the driving signal 302 of FIG. 3). The phase accumulator 606 keeps track of the current phase of the driving signal 302. The transmitter DAC 608 ("transmitter digital-to-analog converter") generates the driving signal 302 based on the output of the phase accumulator 606. Note that every block in filter logic 600 except for transmitter DAC 608 operates in the digital domain. Transmitter DAC 608 generates an analog signal (driving signal 302) based on a digital signal received from phase accumulator 606. The matched filter module 602 obtains a value of the matched filter corresponding to the current phase of the transmitter signal and applies the matched filter to the SD signal at multiplier 612, based on the output of the phase accumulator 606. In some embodiments, the matched filter module 602 negates this value if the driving signal 302 transitioned from high to low voltage in the current driving signal 302 half-period. Multiplier 612 multiplies a value of SD signal with a value of the matched filter, treating 0's of the SD signal as the value −1 and treating 1's of the SD signal as the value +1. The low-pass filter 610 removes high frequency components from the signal received from the multiplier 612 to output an analog-to-digital converter signal ("ADC signal"). The low-pass filter 610 may be an accumulator configured to add all values received in a half-period of the transmitter signal or may be a triangle filter. Negating the value of the matched filter if the driving signal 302 transitions from high to low when multiplying with the SD signal allows the ADC signal to always be positive—allowing for easy comparison between ADC values regardless of the specific driving signal 302 transition type (high to low or low to high). The filter logic 600 is driven with a clock signal ("CLK") that may operate at the same frequency as the clock signal 406 of the sigma-delta converter 400 of FIG. 4.

In some embodiments, the matched filter module 602 may apply an out-of-phase matched filter to the SD signal in addition to the matched filter described above, which is considered to be in-phase. The output would then include in-phase and quadrature-phase components.

Figure 7:
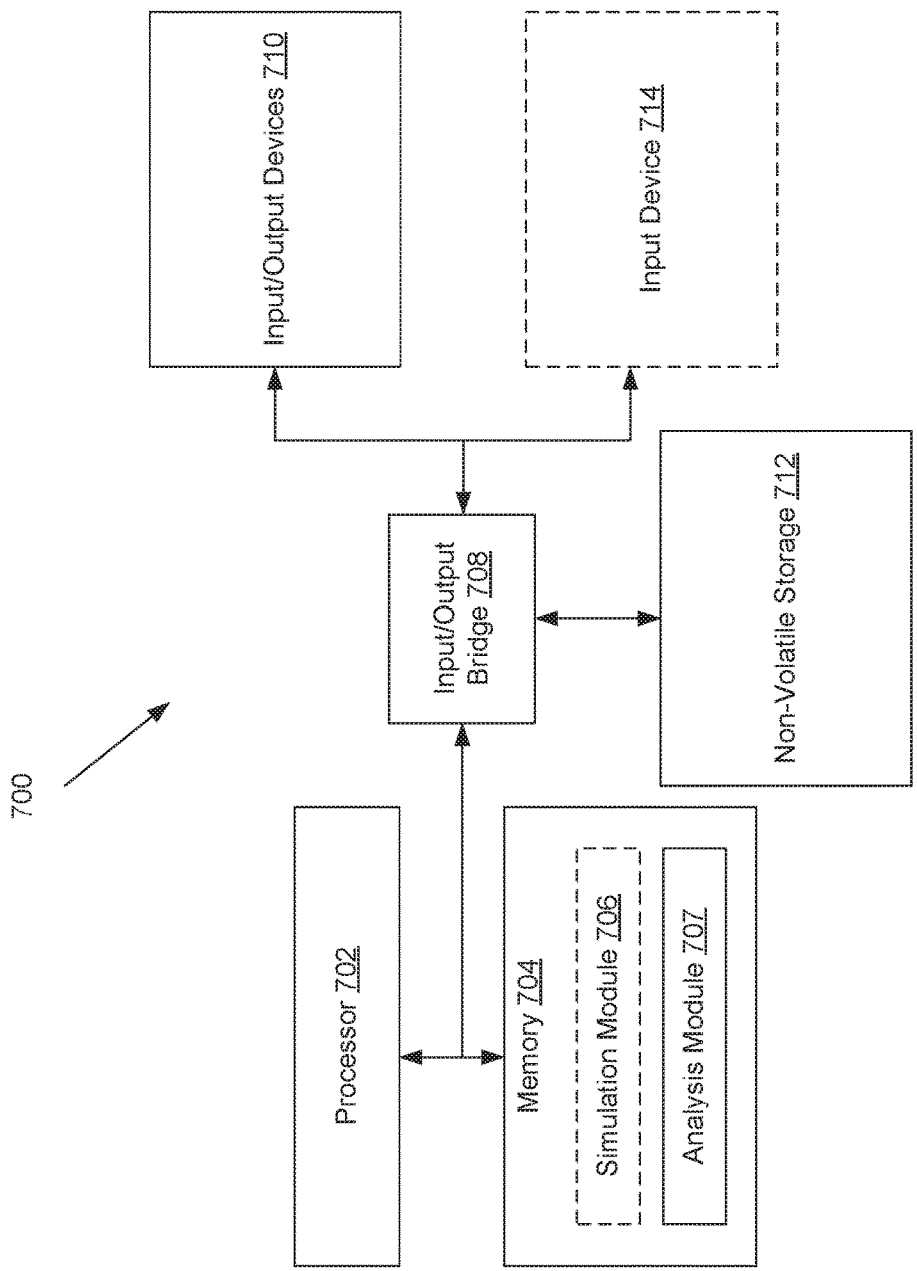
FIG. 7 illustrates a computer system for generating a matched filter, according to an example.

The matched filter may be generated by, for example, a computer system, in conjunction with a simulation or in conjunction with an actual, physical input device. FIG. 7 illustrates a computer system 700 for generating a matched filter, according to an example. As shown, the computer system 700 includes a processor 702, a memory 704, an input/output bridge 708, non-volatile storage 712, input/output devices, and, optionally, an input device 714. The memory stores an analysis module 707 and may store a simulation module 706. The input device 714 may be the input device 100 of FIG. 1.

The processor retrieves data and instructions from memory 704 and performs operations according to those data and instructions. Memory 704 stores data and instructions, including the simulation module 706 and the analysis module 707, for use by processor 702. Non-volatile storage 712 stores data and instructions for use by processor 702 in a non-volatile manner and may include, for example, a hard drive. Input/output devices 710 include devices for providing input to, and receiving output from, processor 702, and may include, for example, a keyboard, a mouse, a monitor, and the like. Input/output bridge operatively couples the processor 702 and the memory 704 to the non-volatile storage 712, the input/output devices 710, and the input device 714.

As described, input device 714 may be the input device 100 of FIG. 1. Thus, input device 714 generally includes a number of sensor electrodes that form capacitive pixels. For example, referring momentarily to FIG. 2A, an intersection between one of the vertically oriented sensor electrodes 230, such as the vertically oriented sensor electrode 230-1 and the horizontally oriented sensor electrodes 220, such as horizontally oriented sensor electrode 220-1, forms a capacitive pixel.

Referring back to FIG. 7, the analysis module 707 generates matched filters for multiple capacitive pixels. Matched filters may be different for different capacitive pixels due to varying impedance characteristics associated with those capacitive pixels. More specifically, referring momentarily to FIG. 3, impedance values $Z_1$ and $Z_2$ may vary depending on the location of the capacitive pixel. Referring back to FIG. 7, for any particular capacitive pixel, the analysis module 707 tests that capacitive pixel (either physically, via input device 714 or in a simulated manner via a simulated input device simulated by simulation module 706) in order to generate a matched filter for that capacitive pixel. More specifically, analysis module 707 performs operations on the input device in a substantially noise-free environment. Such operations would be performed either in a physical environment that is "controlled" and/or known to be noise free (e.g., at design time in a factory) or in a simulation environment that is controlled. Such a noise-free environment includes substantially no input object 140 proximate to the sensor electrode 304.

In such a noise-free environment, analysis module 707 causes input device 714 (or a simulation thereof) to drive a sensor electrode with driving signal 302. A resulting signal is received by a sigma-delta converter 306, which generates an SD signal in response. Analysis module 707 analyzes this sigma-delta signal to obtain a matched filter. The specifics of how analysis module 707 generates the matched filter are provided below with respect to FIGS. 8-10.

Figure 8:
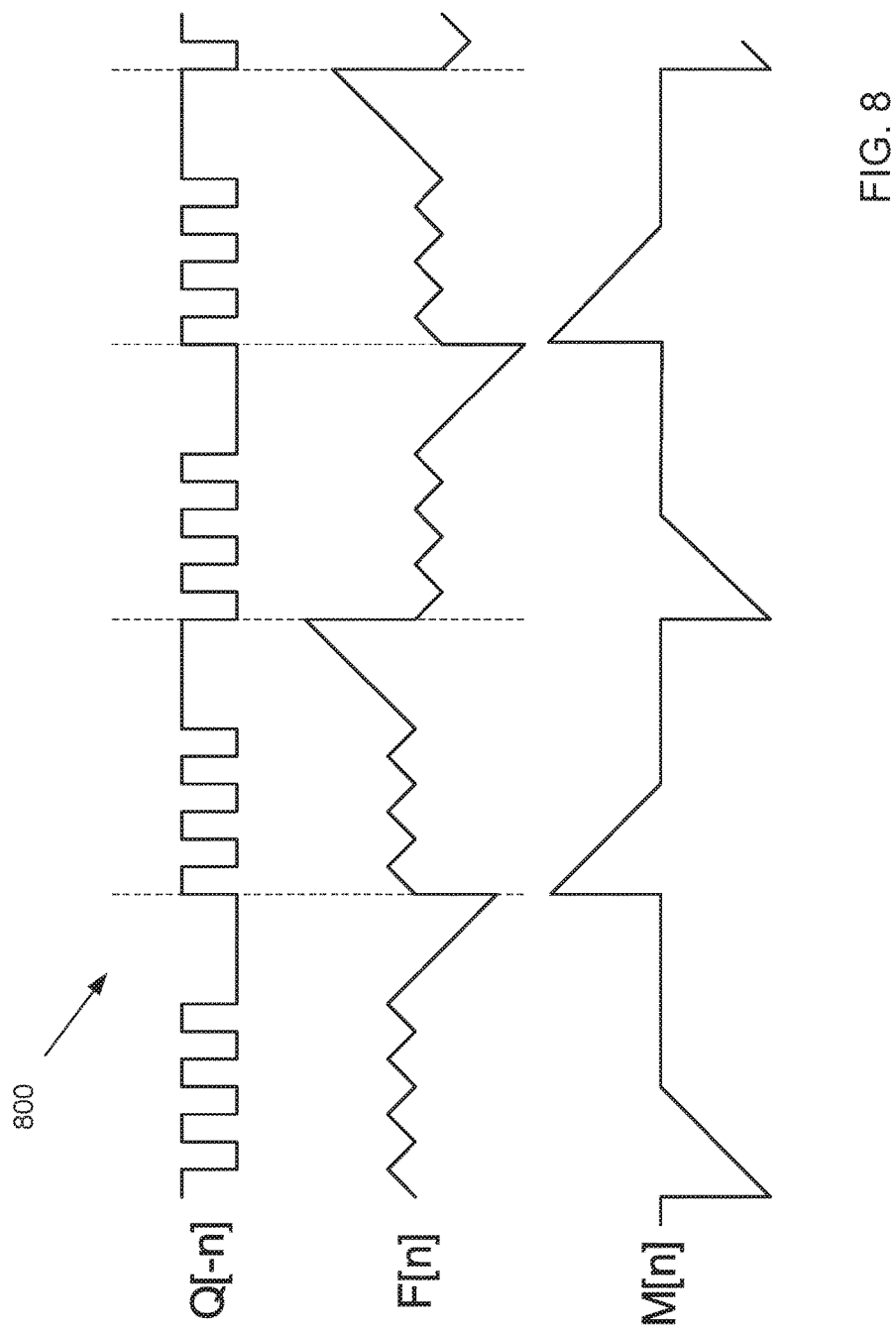
FIG. 8 illustrates a graph that demonstrates how an analysis module processes the SD signal to obtain a matched filter, according to an example.

FIG. 8 illustrates a graph 800 that demonstrates how analysis module 707 processes the SD signal to obtain a matched filter, according to an example. As shown, the graph 800 includes a graph labeled F[n], a graph labeled Q[−n], and a graph labeled M[n]. The graph labeled Q[−n] is a time-reversed version of the SD signal. The graph labeled F[n] is a discrete-time cumulative sum signal that is derived from Q[−n]. The graph labeled M[n] is the matched filter that is generated based on the discrete-time cumulative sum signal.

To generate the matched filter, analysis module 707 obtains the SD signal and time-reverses the SD signal to generate Q[−n]. Analysis module 707 generates F[n] from Q[−n] by, for each particular discrete-time value of Q[−n], treating the "0" values as the value "−1" and treating the "1" values as "+1," and performing a cumulative sum, from the beginning of a certain time period up to the time associated with the particular discrete-time value of Q[−n], to obtain a corresponding value for F[n]. The beginning time is the beginning of a driving signal 302 half-period, which is when DS (FIG. 5) either rises from low to high voltage or falls from high to low voltage. The end is the end of the driving signal 302 half-period (or beginning of the next driving signal 302 half-period), which is when DS (FIG. 5) next either rises from low to high voltage or falls from high to low voltage. In more specific terms, F[n] is calculated as follows (note that this formula explicitly converts the values 0 and 1 in Q[n] into the values −1 and 1 respectively):

$$F[n] = \sum_{i=-n}^{0} 2Q[i] - 1$$

In some embodiments (such as with a long RC time constant or a slowly varying transmitter waveform), the cumulative sum may be performed on Q[n] instead of Q[−n]:

$$F[n] = \sum_{i=0}^{n} 2Q[i] - 1$$

To determine the matched filter M[n] based on F[n], analysis module 707 time-reverses F[n] and applies a low-pass filter to that time-reversed signal to filter out the high frequency variations that are present, for example, in the left-most portion of F[n] shown in FIG. 8. The low pass filter may be a filter that passes frequencies lower than the frequency of the clock signal of the sigma-delta converter 306. The matched filter M[n] approximates the signal Vin for the particular capacitive pixel for which Q[n] was obtained. The matched filter may be stored as constants (where each constant provides the amplitude of a matched filter for a particular digital sample) in registers which are accessed by matched filter module 602 when needed. To save space, data for only a single half-period of driving signal 302 may be stored and, as stated above, negated when needed (i.e., negated when the driving signal transitions from high to low and not negated when the driving signal transitions from low to high).

Conceptually, the matched filter applied by matched filter module serves to amplify, shape, and recover the portion of the SD signal that includes information deemed to be "useful" in determining the capacitance of sensor electrode 304 and to attenuate the portion of the SD signal that does not include information deemed to be "useful". More specifically, the SD signal prior to the point at which oscillation occurs has useful information from which data related to capacitance can be derived. The matched filter combines with this portion of the SD signal to provide output related to the capacitance. The portion after oscillation starts to occur includes mostly noise and is therefore "zeroed out" by the zero amplitude portion of the matched filter.

Due to differences in impedance to transmitter electrodes and from receiver electrodes within input device 100, the signal induced in any particular sensor electrode 304 may be different from that induced in another particular sensor electrode. Differences in impedance may exist because the lengths of traces to any particular pair of sensor electrodes may vary depending on where in the input device 100 the sensor electrodes are located. Thus, a matched filter may be determined for multiple capacitive pixels in the input device 100.

Figure 9:
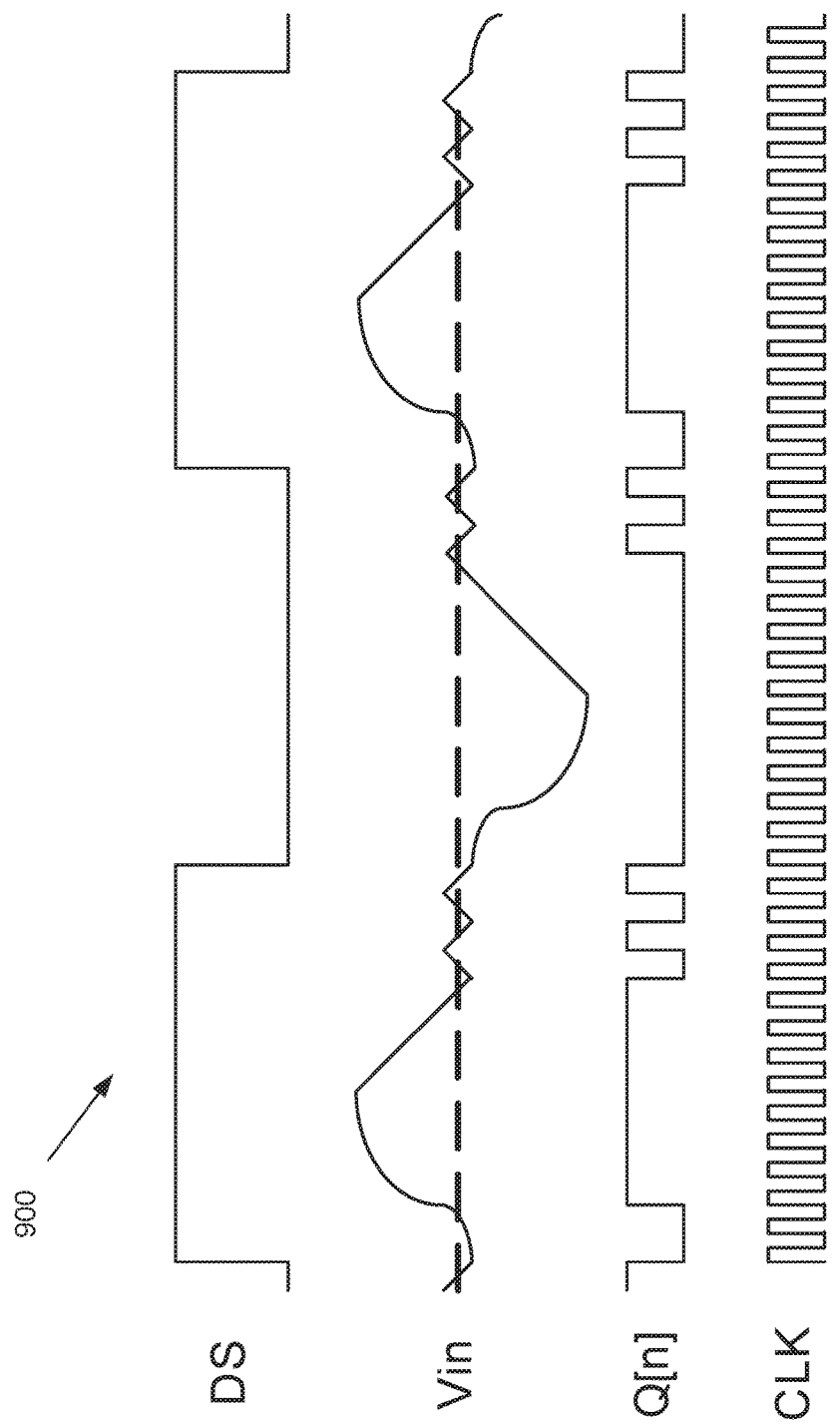
FIG. 9 illustrates a graph that demonstrates how an analysis module processes an SD signal to obtain a matched filter, according to another example.

FIG. 9 is a graph 900 that illustrates plots associated with generating a matched filter for a capacitive pixel with different impedance characteristics to the transmitter electrode and from the receiver electrode than the capacitive pixel associated with FIG. 5, according to an example. As shown, the graph 900 includes a plot labeled DS, a plot labeled Vin, a plot labeled Q, and a plot labeled CLK. The various plots are similar to the plots of FIG. 5. Specifically, DS represents the signal with which the sensor electrode 304 is driven, Vin represents the signal at node Vin in the sigma-delta converter of FIG. 4, Q represents the sigma-delta quantized signal, and CLK represents the clock signal. As can be seen, the signal Vin is more "skewed" to the right (i.e., later in time) than the signal Vin of FIG. 5, a feature that is a result of the different impedance characteristics of a capacitive pixel associated with the Vin plot shown in FIG. 9 as opposed to the Vin plot shown in FIG. 5. Of course, the Q plot is different as well, since the Q plot is dependent on Vin.

Figure 10:
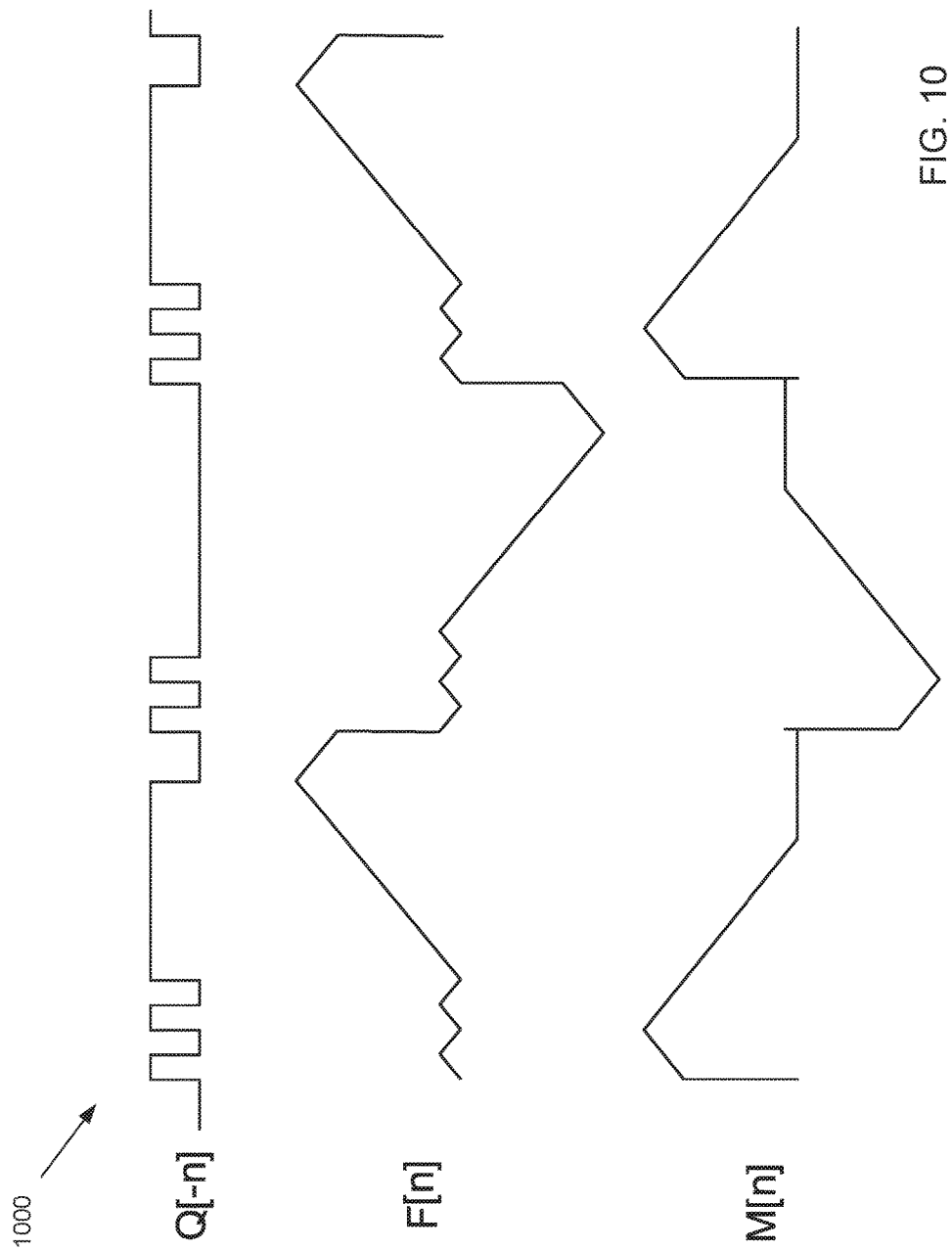
FIG. 10 is a graph that illustrates signals associated with generating a matched filter for the capacitive pixel associated with FIG. 9, according to an example.

FIG. 10 is a graph 1000 that illustrates signals associated with generating a matched filter for the capacitive pixel associated with FIG. 9, according to an example. The graph 1000 includes a time-reversed SD signal (Q[−n]), a discrete-time cumulative sum signal derived from Q[−n], and a matched filter M[n]. These signals are generated in a similar manner as discussed above with respect to FIG. 7. More specifically, the signal Q[−n] is generated by time reversing the signal Q[n] shown in FIG. 9. The signal F[n] is generated by performing a cumulative sum on the time-reversed SD signal Q[−n]. The signal M[n], which is the matched filter, is generated by time-reversing and low-pass-filtering the signal F[n]. The matched filter M[n] would be applied to the SD signal Q[n] by filter logic 308 to process the SD signal Q[n] as described above. Filter logic 308 also applies a low pass filter to the result to generate the ADC signal illustrated in FIG. 3.

Figure 11:
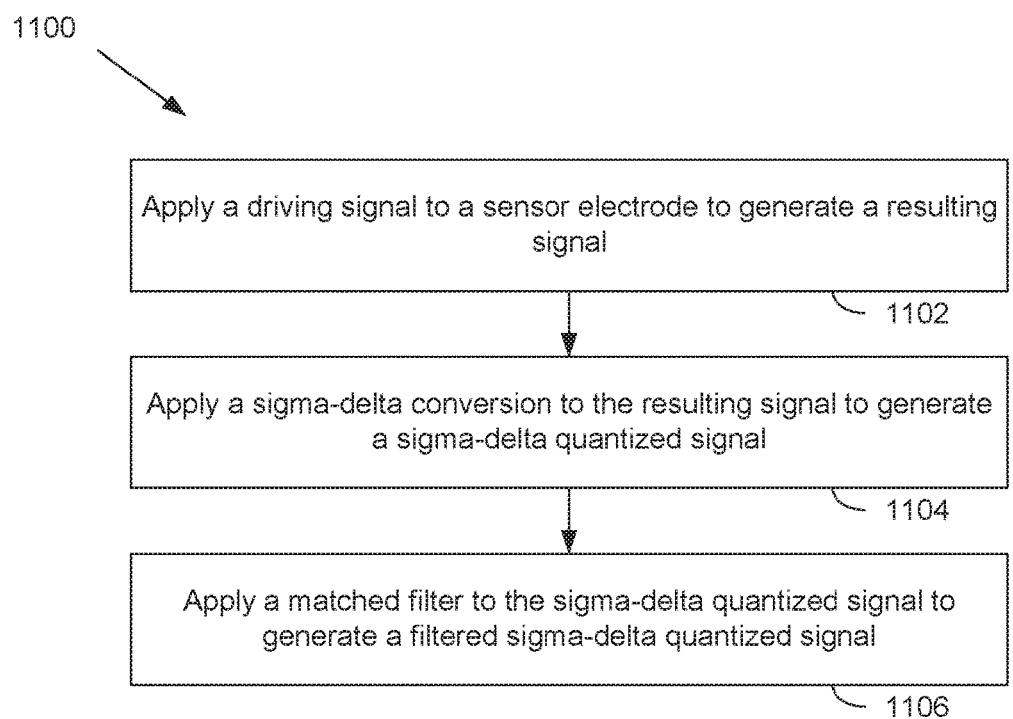
FIG. 11 is a flow diagram of a method of applying a matched filter to a resulting signal received from a sensing electrode, according to an example.

FIG. 11 is a flow diagram of a method 1100 of applying a matched filter to a resulting signal received from a sensing electrode, according to an example. Although the method steps are described in conjunction with the system described in FIGS. 1-10, persons skilled in the art will understand that any system configured to perform the method steps, in various feasible alternative orders, falls within the scope of the present disclosure.

At step 1102, processing system 110 applies a driving signal 302 to a sensor electrode 304 to generate a resulting signal. The driving signal 302 comprises a series of low-high and high-low transitions. The resulting signal generated is based on the capacitance of the sensor electrode 304 and on impedance of traces coupled to the sensor electrode 304.

At step 1104, processing system 110 applies a sigma-delta conversion to the resulting signal to generate a sigma-delta quantized signal. The sigma-delta quantized signal is a digital representation of the resulting signal. Further processing is applied to generate a signal that is representative of the capacitance of the sensor electrode 304. More specifically, at step 1106, processing system 110 applies a matched filter to the sigma-delta quantized signal to generate a filtered sigma-delta quantized signal. The filtered sigma-delta quantized signal allows information related to the capacitance of sensor electrode 304 to be recovered.

Figure 12:
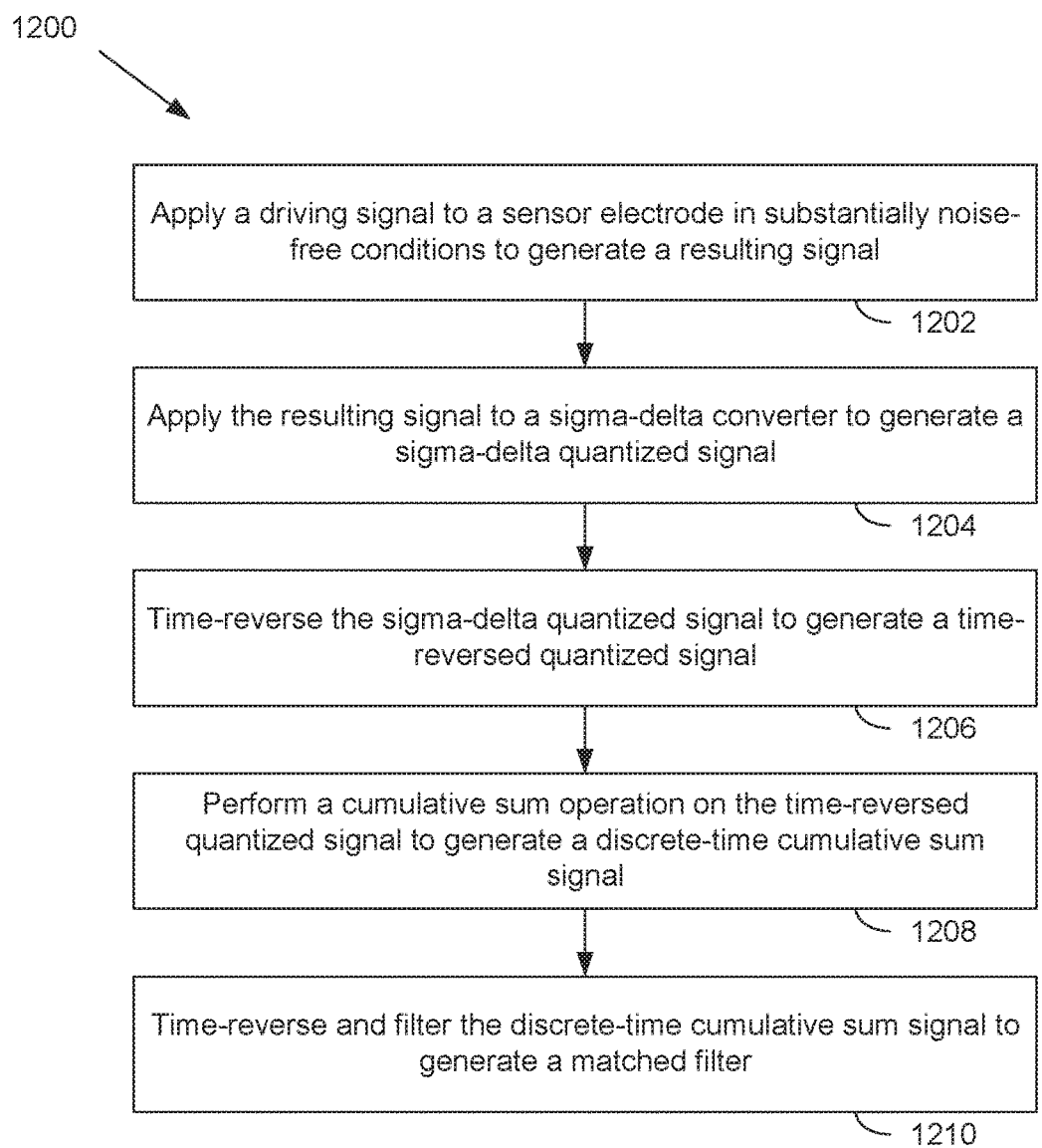
FIG. 12 is a flow diagram of a method of generating a matched filter for a resulting signal received from a sensing electrode, according to an example.

FIG. 12 is a flow diagram of a method 1200 of generating a matched filter for a resulting signal received from a sensing electrode, according to an example. Although the method steps are described in conjunction with the system described in FIGS. 1-10, persons skilled in the art will understand that any system configured to perform the method steps, in various feasible alternative orders, falls within the scope of the present disclosure.

At step 1202, processing system 110 (or simulation module 706) applies a driving signal to a sensor electrode 304 in substantially noise free conditions (either in an actual input device or in a simulated device) to generate a resulting signal. The resulting signal is representative of the capacitance of the sensor electrode 304 in a noise free environment. At step 1204, analysis module 707 receives the resulting signal and applies the resulting signal to a sigma-delta converter to generate a sigma-delta quantized signal. At step 1206, analysis module 707 time-reverses the sigma-delta quantized signal to generate a time-reversed quantized signal. At step 1208, analysis module 707 performs a cumulative sum operation on the time-reversed quantized signal to generate a discrete-time cumulative sum signal. The cumulative sum is performed for each driving signal half-period and is performed from the beginning of the half-period (i.e., when the signal transitions from low to high or high to low) to the end of the half-period (i.e., the next time the signal transitions from low to high or high to low). At step 1210, analysis module 707 time-reverses and filters the discrete-time cumulative sum signal to generate the matched filter. The matched filter can be stored as constants in registers in matched filter module 602 for use when filter logic 308 receives sigma-delta quantized signals from sigma-delta converter 306.

Advantageously, techniques are provided whereby a matched filter is used in conjunction with a sigma-delta converter, to process signals received with a capacitive sensing electrode. Use of a sigma-delta converter reduces the amount of analog circuitry included in a processing system, which allows the processing system to be smaller, thereby improving manufacturing cost. Further, using a matched filter improves the signal-to-noise ratio of the signal received from the sigma-delta converter, thereby improving the ability to detect presence of an input object using the sigma-delta converter.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A processing system for generating filtered digital data, the processing system comprising:
   a sigma-delta converter configured to:
      receive a first resulting signal, and
      apply sigma-delta conversion to the first resulting signal to generate a first sigma-delta quantized signal; and
   a filter logic unit configured to:
      determine a first matched filter based on an impedance-characteristic of one or more transmission lines through which the first resulting signal has traveled; and
      apply the first matched filter to the first sigma-delta quantized signal to generate a first filtered sigma-delta quantized signal.

2. The processing system of claim 1, wherein:
   the first matched filter is configured to approximate a substantially noise-free resulting signal.

3. The processing system of claim 1, wherein:
   the first matched filter is based on a discrete time cumulative sum signal.

4. The processing system of claim 3, wherein:
   the discrete time cumulative sum signal comprises a series of values, each value being a cumulative sum of a baseline sigma-delta quantized signal up to a phase index corresponding to the value.

5. The processing system of claim 3, wherein:
   the discrete time cumulative sum signal comprises a series of values, each value being a cumulative sum of a time-reversed baseline sigma-delta quantized signal up to a phase index corresponding to the value.

6. The processing system of claim 5, wherein:
   the first matched filter comprises a time-reversed version of the discrete time cumulative sum signal with high frequencies filtered out, the high frequencies substantially equal to or greater than a clock signal frequency that is associated with the baseline sigma-delta quantized signal.

7. The processing system of claim 1, wherein:
   the sigma-delta converter is further configured to:
      receive a second resulting signal, and
      apply sigma-delta conversion to the second resulting signal to generate a second sigma-delta quantized signal; and
   the filter logic unit is further configured to:
   determine a second matched filter based on an impedance-characteristic of one or more transmission lines through which the second resulting signal has traveled; and
   apply the second matched filter to the second sigma-delta quantized signal to generate a second filtered sigma-delta quantized signal, the second matched filter differing from the first matched filter in a manner that is based on differences in impedance characteristics associated with the first resulting signal and the second resulting signal.

8. The processing system of claim 1, wherein:
   the first matched filter is periodic; and
   the filter logic unit is further configured to store the first matched filter as a plurality of constants in a phase-indexed lookup table.

9. The processing system of claim 1, wherein the filter logic is further configured to:
   apply a second matched filter that is phase-shifted with respect to the first matched filter by approximately 90 degrees to the first sigma-delta quantized signal to generate a quadrature-phase filtered sigma-delta quantized signal.

10. A method for generating filtered digital data, the method comprising:
receiving a first resulting signal;
applying sigma-delta conversion to the first resulting signal to generate a first sigma-delta quantized signal; and
determining a first matched filter based on an impedance-characteristic of one or more transmission lines through which the first resulting signal has traveled; and
applying the first matched filter to the first sigma-delta quantized signal to generate a first filtered sigma-delta quantized signal.

11. The method of claim 10, wherein:
the first matched filter is configured to approximate a substantially noise-free resulting signal.

12. The method of claim 10, wherein:
the first matched filter is based on a discrete time cumulative sum signal.

13. The method of claim 12, wherein:
the discrete time cumulative sum signal comprises a series of values, each value being a cumulative sum of a baseline sigma-delta quantized signal up to a phase index corresponding to the value.

14. The method of claim 12, wherein:
the discrete time cumulative sum signal comprises a series of values, each value being a cumulative sum of a time-reversed baseline sigma-delta quantized signal up to a phase index corresponding to the value.

15. The method of claim 14, wherein:
the first matched filter comprises a time-reversed version of the discrete time cumulative sum signal with high frequencies filtered out, the high frequencies substantially equal to or greater than a clock signal frequency that is associated with the baseline sigma-delta quantized signal.

16. The method of claim 10, further comprising:
receiving a second resulting signal;
applying sigma-delta conversion to the second resulting signal to generate a second sigma-delta quantized signal;
determining a second matched filter based on an impedance-characteristic of one or more transmission lines through which the second resulting signal has traveled; and
applying the second matched filter to the second sigma-delta quantized signal to generate a second filtered sigma-delta quantized signal, the second matched filter differing from the first matched filter in a manner that is based on differences in impedance characteristics associated with the first resulting signal and the second resulting signal.

17. The method of claim 10, wherein:
the first matched filter is periodic; and, the method further comprises:
storing the first matched filter as a plurality of constants in a phase-indexed lookup table.

18. The method of claim 10, further comprising:
applying a second matched filter that is phase-shifted with respect to the first matched filter by approximately 90 degrees to the first sigma-delta quantized signal to generate a quadrature-phase filtered sigma-delta quantized signal.

19. An input device, comprising:
a plurality of sensing elements; and
a processing system coupled to the plurality of sensing elements, the processing system comprising:
a sigma-delta converter configured to:
receive a first resulting signal with a first sensing element of a plurality of sensing elements, and
apply sigma-delta conversion to the first resulting signal to generate
a first sigma-delta quantized signal; and
a filter logic unit configured to:
determine a first matched filter based on an impedance-characteristic of one or more transmission lines through which the first resulting signal has traveled; and
apply the first matched filter to the first sigma-delta quantized signal to generate a first filtered sigma-delta quantized signal.

20. The input device of claim 19, wherein:
the first matched filter is configured to approximate a substantially noise-free resulting signal received with the first sensing element.

* * * * *